(12) United States Patent
Hathaway et al.

(10) Patent No.: US 11,950,510 B2
(45) Date of Patent: Apr. 2, 2024

(54) SUPERCONDUCTOR JUNCTION FOR A SOLID STATE COOLER

(71) Applicants: Aaron Ashley Hathaway, Baltimore, MD (US); Edward R. Engbrecht, Odenton, MD (US); John X. Przybysz, Severna Park, MD (US); Robert Miles Young, Ellicott City, MD (US)

(72) Inventors: Aaron Ashley Hathaway, Baltimore, MD (US); Edward R. Engbrecht, Odenton, MD (US); John X. Przybysz, Severna Park, MD (US); Robert Miles Young, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 177 days.

(21) Appl. No.: 17/592,329

(22) Filed: Feb. 3, 2022

(65) Prior Publication Data

US 2023/0247905 A1    Aug. 3, 2023

(51) Int. Cl.
*H10N 10/17*    (2023.01)
*H10N 10/01*    (2023.01)
(Continued)

(52) U.S. Cl.
CPC ............. *H10N 10/17* (2023.02); *H10N 10/01* (2023.02); *H10N 10/82* (2023.02); *H10N 10/8552* (2023.02)

(58) Field of Classification Search
CPC .... H10N 10/17; H10N 10/8552; H10N 10/01; H10N 10/82
See application file for complete search history.

(56) References Cited

U.S. PATENT DOCUMENTS

| 5,974,806 A | * | 11/1999 | Pekola | ................... H10N 60/10 62/3.1 |
| 6,581,387 B1 | * | 6/2003 | Ullom | ................... H10N 60/10 62/3.1 |

(Continued)

OTHER PUBLICATIONS

Hsieh, et al.: "Diffusion of Quasiparticles in Superconducting Aluminum Films"; Physical Review Letters, vol. 20, No. 26, Jun. 26, 1968; pp. 1502-1504.

(Continued)

*Primary Examiner* — Golam Mowla
(74) *Attorney, Agent, or Firm* — Tarolli, Sundheim, Covell & Tummino LLP

(57) ABSTRACT

A superconductor junction includes a normal metal layer having a first side and a second side, an insulating layer overlying the second side of the normal metal layer, and a first superconductor layer formed of a first superconductor material that overlies a side of the insulating layer opposite the side that overlies the normal metal layer. The superconductor junction further includes a second superconductor layer formed of a second superconductor material with a first side overlying a side of the first superconductor material opposite the side that overlies the insulating layer. The second superconductor material has a higher diffusion coefficient than the first superconductor material and/or the second superconductor material has a lower recombination coefficient than the first superconductor metal layer. A normal metal layer quasiparticle trap is coupled to a second side of the second superconductor layer.

20 Claims, 5 Drawing Sheets

(51) Int. Cl.
*H10N 10/82* (2023.01)
*H10N 10/855* (2023.01)

(56) References Cited

U.S. PATENT DOCUMENTS

| | | | |
|---|---|---|---|
| 10,644,218 | B1 | 5/2020 | Hathaway et al. |
| 10,998,485 | B1 | 5/2021 | Przybysz et al. |
| 2009/0137398 | A1 | 5/2009 | Bozovic et al. |
| 2021/0063060 | A1 | 3/2021 | Young et al. |
| 2021/0066571 | A1 | 3/2021 | Hathaway et al. |
| 2021/0257533 | A1 | 8/2021 | Hathaway et al. |

OTHER PUBLICATIONS

Leo, et al.: "Quasiparticle scattering time in niobium superconducting films"; Physical Review B 84, 014536 (2011); DOI: 10.1103/PhysRevB.84.014536; pp. 014536-1 thru 014536-7.

Muhonen, et al.: "Micrometer-scale refrigerators"; arXiv:1203.5100v1 [cond-mat.mes-hall] Mar. 22, 2012; pp. 1-42.

Nguyen, et al.: "Trapping hot quasi-particles in a high-power superconducting electronic cooler"; New Journal of Physics 15, (2013) 085013 (9pp), Published Aug. 13, 2013, Online at http://www.njp.org/, doi:10.1088/1367-2630/15/8/085013.

Nguyen, et al.: "A cascade electronic refrigerator using superconducting tunnel junctions"; arXiv:1605.00830v1 [cond-mat.mes-hall] May 3, 2016; pp. 1-7.

O'Neil, et al.: "Measurement and modeling of a large-area normal-metal/insulator/superconductor refrigerator with improved cooling"; Physical Review B 85, 134504 (2012), DOI: 10.1103/PhysRevB.85.134504; pp. 1-13.

Kemppinen, et al.: "Cascaded Superconducting Junction Refrigerators: Optimization and Performance Limits"; Appl. Phys. Lett. 119, 052603 (2021); https://doi.org/10.1063/5.0060652 Submitted: Jun. 21, 2021 . Accepted: Jul. 26, 2021 . Published Online: Aug. 5, 2021.

International Search Report and Written Opinion for corresponding PCT/US2023/010103, dated May 8, 2023, pp. 1-12.

\* cited by examiner

| Material | Function | SC Transition Temp. Tc, K | SC Gap Δ₀, meV | Q-P Diffusion Coef, cm²/s | Q-P Recomb. Coef, µm³/s |
|---|---|---|---|---|---|
| Nb | Energy filter | 9.2 | 1.36 | 8.7 | 311 |
| Al | Transport layer | 1.2 | 0.172 | 122 | 22 |

| Material | Function | SC Transition Temp. Tc, K | SC Gap Δ₀, meV | Q-P Diffusion Coef, cm²/s | Q-P Recomb. Coef, µm³/s |
|---|---|---|---|---|---|
| Nb | Energy filter | 9.2 | 1.36 | 8.7 | 311 |
| Sn | Transport layer | 3.75 | 0.57 | 371 | 306 |

| Material | Function | SC Transition Temp. Tc, K | SC Gap Δ₀, meV | Q-P Diffusion Coef, cm²/s | Q-P Recomb. Coef, µm³/s |
|---|---|---|---|---|---|
| Sn | Energy filter | 3.75 | 0.57 | 371 | 306 |
| Al | Transport layer | 1.2 | 0.172 | 122 | 22 |

FIG. 3 the second superconductor material. A normal metal layer quasiparticle trap is coupled to a second side of the second superconductor layer.

In another example a cooler device is disclosed that comprises a pair of normal metal-insulator-superconductor-superconductor-normal metal ($NIS_1S_2N$) junctions. Each $NIS_1S_2N$ junction comprises a normal metal layer having a first side and a second side, an insulating layer overlying the second side of the normal metal layer, a first superconductor layer formed of a first superconductor material, the first superconductor layer having a first side overlying a side of the insulating layer opposite the side that overlies the normal metal layer, and a second superconductor layer formed of a second superconductor material, the second superconductor layer having a first side overlying a side of the first superconductor material opposite the side that overlies the insulating layer. The second superconductor material has a higher diffusion coefficient than the first superconductor material and/or the second superconductor material has a lower recombination coefficient than the first superconductor layer, wherein the first superconductor layer has a thickness of about 1 coherence length to about 3 coherence lengths associated with the first superconductor material and the second superconductor layer has a thickness of at least 4 coherence lengths associated with the second superconductor material. Each $NIS_1S_2N$ junction further comprises a normal metal layer quasiparticle trap coupled to a second side of the second superconductor layer via a normal metal bump bond, wherein a bias voltage applied between the normal metal layer quasiparticle trap of a first $NIS_1S_2N$ junction of the pair of $NIS_1S_2N$ junctions and the normal metal layer quasiparticle trap of a second $NIS_1S_2N$ junction of the pair of $NIS_1S_2N$ junctions causes hot electrons to be removed from the normal metal layer through the insulating layer of the second $NIS_1S_2N$ junction, the first superconductor layer of the second $NIS_1S_2N$ junction, the second superconductor layer of the second $NIS_1S_2N$ junction to the normal metal layer quasiparticle trap of the second $NIS_1S_2N$ junction.

In yet another example, a method of forming a superconductor junction is provided. The method includes providing a normal metal layer having a first side and a second side, disposing an insulating layer over the second side of the normal metal layer, disposing a first superconductor layer formed of a first superconductor material with a first side over a side of the insulating layer opposite the side that overlies the normal metal layer, and disposing a second superconductor layer formed of a second superconductor material with a first side over a side of the first superconductor material opposite the side that overlies the insulating layer. The second superconductor material has a higher diffusion coefficient than the first superconductor material and/or the second superconductor material has a lower recombination coefficient than the first superconductor material, wherein the first superconductor layer has a thickness of about 1 coherence length to about 3 coherence lengths associated with the first superconductor material and the second superconductor layer has a thickness of at least 4 coherence lengths associated with the second superconductor material. The method further includes coupling a normal metal layer quasiparticle trap to a second side of the second superconductor layer with or without a normal metal bump bond.

SUPERCONDUCTOR JUNCTION FOR A SOLID STATE COOLER

TECHNICAL FIELD

The present invention relates generally to superconductors, and more particularly to a superconductor junction for a solid state cooler.

BACKGROUND

Solid-state electron cooling by the tunneling of "hot" electrons across a normal metal-insulator-superconductor (NIS) junction, using a bias voltage, has been proven to work below 1 K, substantially operating like the more familiar near room-temperature expensive Peltier thermoelectric refrigerator. These NIS cryo-coolers are built from the same materials as Josephson junctions used in the superconducting circuitry and by the same lithography fabrication foundry tools, and are fundamentally completely compatible with the Josephson junction components. They could be integrated alongside the Josephson junctions themselves, fabricated concurrently. However, currently NIS coolers have a very limited temperature throw, with a maximum temperature difference between hot and cold sides of ~150 mK.

One of the main limitations to NIS coolers' full performance is the presence in the superconducting leads of non-equilibrium quasi-particles arising from the high current running through the device. The low quasi-particle relaxation rate and thermal conductivity in a superconductor bind these hot particles in the vicinity of the junction and lead to severe overheating in the superconducting electrodes. There are several methods for reducing the accumulation of quasi-particles in a superconductor. The most common method is to use a normal metal coupled to the superconductor referred to as a quasiparticle trap, such that quasi-particles migrate to the normal metal and relax their energy there through electron-electron and electron-phonon interaction. This device is referred to as a normal metal-insulator-superconductor-normal metal (NISN) junction. However, phonon heat generated in the quasiparticle trap can migrate back to the superconducting electrodes also limiting the temperature difference between the hot side and cold sides of the NISN junction solid state cooler.

SUMMARY

In one example, a superconductor junction includes a normal metal layer having a first side and a second side, an insulating layer overlying the second side of the normal metal layer, and a first superconductor layer formed of a first superconductor material that overlies a side of the insulating layer opposite the side that overlies the normal metal layer. The superconductor junction further includes a second superconductor layer formed of a second superconductor material with a first side overlying a side of the first superconductor material opposite the side that overlies the insulating layer. The second superconductor material has a higher quasi-particle diffusion coefficient than the first superconductor material and/or the second superconductor material has a lower quasi-particle recombination coefficient than the first superconductor layer, wherein the first superconductor layer has a thickness of about 1 coherence length to about 3 coherence lengths associated with the first superconductor material and the second superconductor layer has a thickness of at least 4 coherence lengths associated with

BRIEF DESCRIPTION OF THE DRAWINGS

FIG. 3 illustrates a table of parameters of different superconductor pair combinations with a first superconductor layer that function as an energy filter and a second superconductor layer that functions as a transport layer.

DETAILED DESCRIPTION

Figure 1:
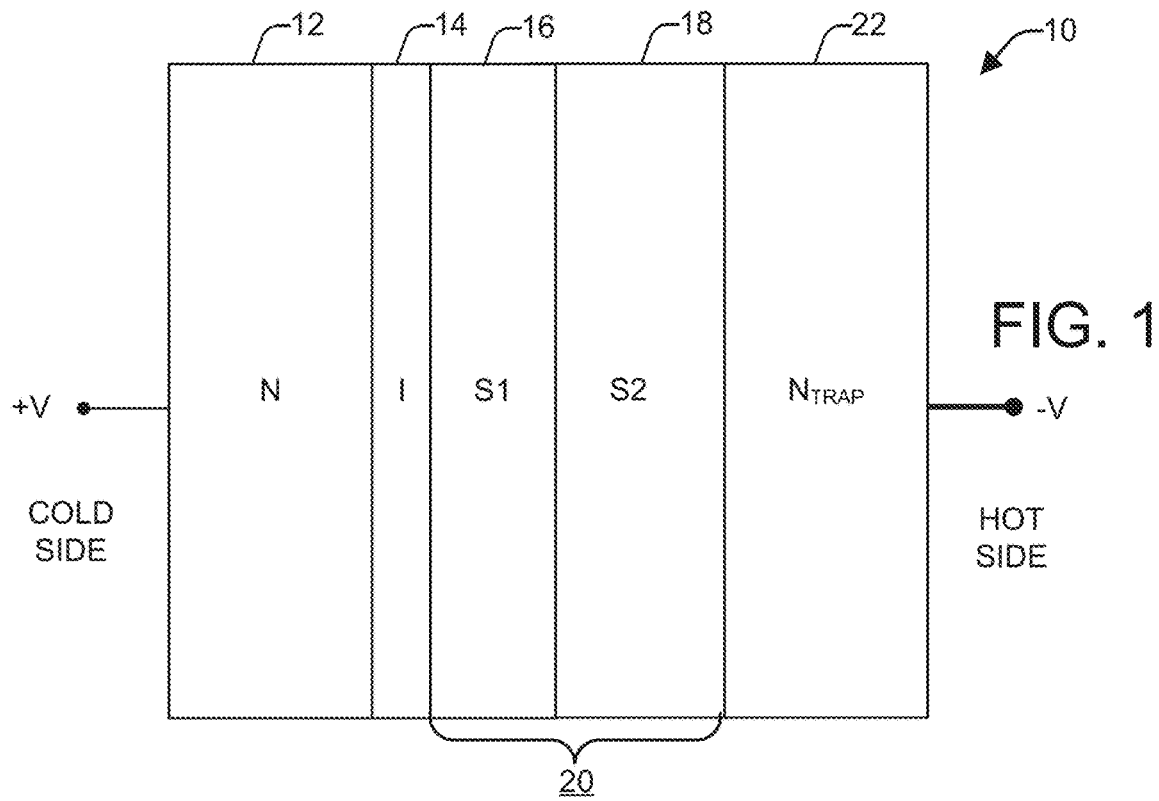
FIG. 1 illustrates an example schematic illustration of a side-view of a cross-section of a superconductor junction.

The disclosure relates to a superconductor junction composed of a normal metal-insulator-superconductor metal structure (NIS) with the superconductor metal structure being formed of a first superconductor layer adjacent the insulator and a second superconductor layer adjacent the first superconductor layer. A normal metal is a metal that does not superconduct at cryogenic operating temperatures. A normal metal trap layer can be coupled to the second superconductor layer by a normal metal bump bond or disposed on the second superconductor layer opposite the first superconductor layers to form a $NIS_1S_2N$ junction. The normal metal trap layer functions as a quasiparticle trap. A voltage can be placed across the $NIS_1S_2N$ junction to raise some electrons above the fermi level in the normal metal. These hot electrons (quasiparticles) tunnel across the insulator layer into the first superconductor layer, thus removing heat from the normal metal layer. The hot electrons then move readily to the second superconductor layer since it has a lower energy bandgap than the first superconductor layer. Finally, the hot electrons move into the normal metal layer quasiparticle trap on the hot side of the $NIS_1S_2N$ junction. The decreasing superconducting energy gaps reduces the quasiparticle backflow, while the use of a quasiparticle trap inhibits the quasi particles from reintegrating into phonons while in the superconducting material.

However, as the quasiparticles travel through the superconductor layers, the quasiparticles can recombine into Cooper pairs, which results in the generations of phonons (heat) due to the time it takes to travel through the superconductor material. Phonons are quantized lattice vibrations that carry the heat in superconductors, and partially carry heat in normal metals. Normal metals will also carry heat by electrons. Each time the heat encounters a superconductor layer, the heat primarily is carried by phonons as vibrations. The vibrations have a dominant wavelength based on the specific material and its current temperature. Each superconductor material has a specific diffusion coefficient ($cm^2/s$) that defines the rate that quasiparticles diffuse across a specific superconductor material and a recombination coefficient ($\mu m^3/s$) that defines the rate that quasiparticles can travel before recombining into Cooper pairs in a specific superconductor material. It is desirable to have a superconductor material with a high diffusion coefficient and a low recombination coefficient to minimize recombination of quasiparticles into Cooper pairs.

However, another limitation is the cryogenic temperature (required to have successful operation of the junction). That is the superconductor operates as an energy filter for proper operation of the NISN junction at half of its transition temperature (temperature necessary to superconduct). The lower the cryogenic temperatures, the more expensive the refrigeration requirement to maintain the superconducting properties of the superconductor layer of the $NIS_1S_2N$ junction. Unfortunately, certain superconductors with higher transition temperatures also have higher recombination coefficients and/or lower diffusion coefficients. These problems are addressed by selecting a superconducting material of the second superconductor layer that has a relatively high diffusion coefficient and/or low recombination coefficient relative to the superconductor material of the first superconductor layer. That is the diffusion coefficient of the second superconductor layer is greater than the diffusion coefficient of the first superconductor layer and/or the recombination coefficient of the second superconductor layer is less than the recombination coefficient of the first superconductor layer. This reduces the recombination of quasiparticles into Cooper pairs that results in the generation of heat in the superconductor materials. The first superconductor layer functions as an energy filter and the second superconductor layer functions as a transport layer of the superconductor junction.

For example, niobium could be used to form a NIS junction with a large thermal lift because of its large energy gap. However, niobium has a diffusion constant of 8.7 $cm^2/s$ and a recombination constant of 311 $\mu m^3/s$. This results in an unacceptably large quasiparticle loss when attempting to construct a junction with a diffusion path longer than 0.1 um. As an example, in order to maintain a low quasi particle loss, a second thick layer of aluminum is deposited on top of a superconductor layer of the NIS junction providing a layer that has a comparatively high diffusion rate and a low recombination rate. Aluminum has a diffusion constant of 122 $cm^2/s$ and a recombination constant of 22 $\mu m^3/s$ allowing for the construction of large junctions.

Superconductors can proximitize each other. Therefore a thickness greater than 4 coherence lengths is typically desired to ensure that the layers function correctly. There is also a thermal boundary resistance mismatch between the superconductors. This will be tuned to block the dominant phonon wavelength which will prevent phonons from the "hot" electron trap from flowing into the NIS Junction. The dominant phonon wavelength is an approximation that at any temperature the heat is predominately carried by a single frequency $v_{max}$ of the phonon vibrations. The dominant phonon wavelength is then found as $\lambda_{dom}=v/v_{max}$, where v is the speed of sound. Similar to optical fibers, by choosing film layer thicknesses that are ¼ wavelength (or a multiple), a phonon filter can be setup where constructive interference at each layer minimizes the phonon heat flow.

In one example, the superconductor junction can be employed to separate circuitry residing on different superconducting structures in a multi-chip device. The superconductor junction can be a bump bond structure or part of a bump bond structure that also bonds two chips together in a multi-chip device. In another example, the superconductor junction can be employed in a solid state cooler device that can be employed in a refrigeration system. The solid state cooler devices can form a last refrigeration stage in a plurality of refrigeration stages to provide cooling down to milliKelvin temperatures.

FIG. 1 illustrates an example schematic illustration of a side-view of a cross-section of a superconductor junction 10.

The superconductor junction 10 can be configured as a refrigeration stage employed in a cryogenic cooling application in which the superconductor thermal cooler is configured as a solid state device that is one of a plurality of solid state cooler devices placed around a refrigeration container that resides in a vacuum and holds superconducting circuitry. The plurality of solid state devices can provide the final stage in a cryogenic refrigeration system, and allow for efficient cooling by removal of heat from a cold side of the refrigeration stage, and prevent the return of heat from the hot side of the last refrigeration stage within a plurality of refrigeration stages. Alternatively, the superconductor junction 10 can be employed as a connecting structure between two devices, such that the connecting structure is a multilayer connector or a bump bond structure.

The superconductor junction 10 is a NISN device with the superconductor portion being a multilayer superconductor structure 20 that forms a $NIS_1S_2N$ device. The superconductor junction 10 includes a normal metal layer 12 having a first side disposed on a cold side of the superconductor junction 10. The normal metal layer 12 has a second side separated from the multilayer superconductor structure 20 by an insulator layer 14. A normal metal layer quasiparticle trap 22 has a first side disposed on a second or hot side of the superconductor junction 10. The normal metal layer quasiparticle trap 22 has a second side disposed on a side of the multilayer superconductor structure 20 opposite the side of the multilayer superconductor structure disposed on the insulator layer 14. The multilayer superconductor structure 20 includes a first superconductor layer 16 ($S_1$) with a first energy bandgap, and a second superconductor layer 18 ($S_2$) with a second energy bandgap. The first energy bandgap is greater than the second energy bandgap.

The first superconductor layer 16 ($S_1$) is formed of a first superconductor material and the second superconductor layer 18 ($S_2$) is formed of a second superconductor material. The diffusion coefficient of the second superconductor material is selected to be greater than the diffusion coefficient of the first superconductor material ($S_1$) and/or the recombination coefficient of the second superconductor material is selected to be less than the recombination coefficient of the first superconductor material. This allows for the rapid diffusion of quasiparticles and/or reduces the recombination of quasiparticles into Cooper pairs that results in the generation of heat in the superconductor materials as the quasiparticles travel through the multilayer superconductor structure 20.

In one example, the first superconductor layer 16 ($S_1$) is formed of niobium (Nb) with a diffusion coefficient of 8.7 $cm^2/s$ and a recombination coefficient of 311 $um^3/s$, and the second superconductor layer 18 ($S_2$) is formed of aluminum (Al) with diffusion coefficient of 122 $cm^2/s$ and a recombination coefficient of 22 $um^3/s$. In another example, the first superconductor layer 16 ($S_1$) is formed of niobium (Nb) with a diffusion coefficient of 8.7 $cm^2/s$ and a recombination coefficient of 311 $um^3/s$, and the second superconductor layer 18 ($S_2$) is formed of tin (Sn) with diffusion coefficient of 371 $cm^2/s$ and a recombination coefficient of 306 $um^3/s$. In yet another example, the first superconductor layer 16 ($S_1$) is formed of tin (Sn) with diffusion coefficient of 371 $cm^2/s$ and a recombination coefficient of 306 $um^3/s$, and the second superconductor layer 18 ($S_2$) is formed of aluminum (Al) with diffusion coefficient of 122 $cm^2/s$ and a recombination coefficient of 22 $um^3/s$. The above mentioned diffusion coefficients and recombination coefficients are just examples and could vary based on particular quality and process variances of the formation of the superconductor materials.

Figure 2:
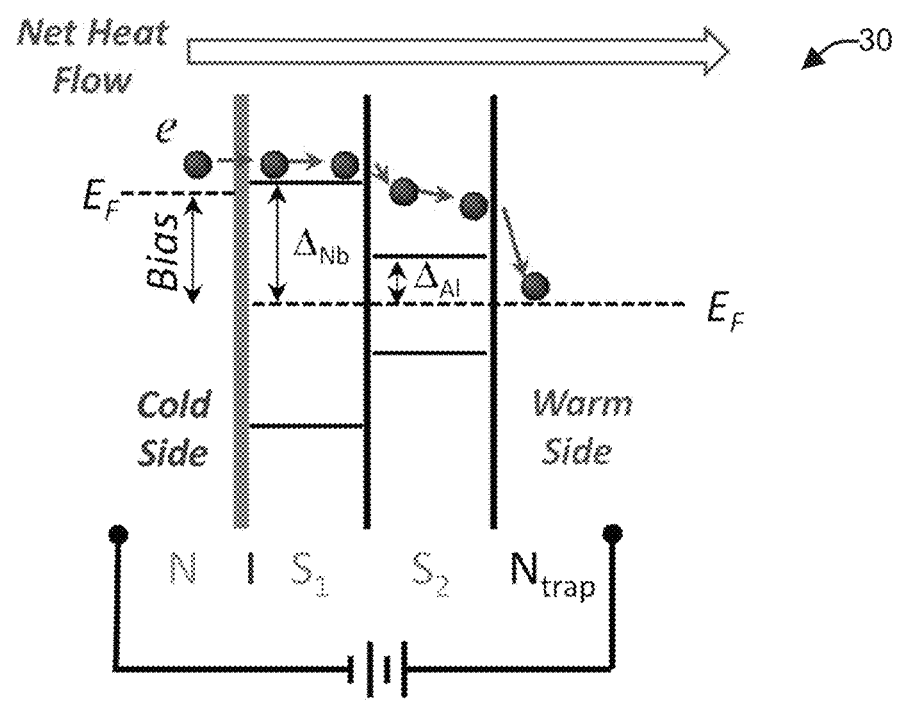
FIG. 2 illustrates a graph that shows the principle of operation and the net heat flow of the superconductor junction of FIG. 1.

A bias voltage (+V/−V) is applied between the normal metal layer 12 disposed on the cold side of the superconductor junction 10 and the normal metal layer quasiparticle trap 22 disposed on the hot side of the superconductor junction 10. The bias voltage (V+/−V) raises the energy level of the hot electrons on the normal metal layer 12. FIG. 2 illustrates a graph 30 that shows the principle of operation and the net heat flow of the superconductor junction 10 of FIG. 1, where hot electrons in the normal metal layer 12 above the Fermi level tunnel across the insulator layer 14 into the first superconductor layer 16 ($S_1$), thus removing heat from the normal metal layer 12. The hot electrons then move readily to the second superconductor layer 18 ($S_2$) since it has a lower energy bandgap that the first superconductor layer 16 ($S_1$). Finally, the hot electrons move into the normal metal layer quasiparticle trap 22 on the hot side of the superconductor junction 10. The decreasing superconducting energy gaps reduces the quasiparticle backflow, while the use of a quasiparticle trap inhibits the quasi particles from reintegrating into the superconducting material.

In one example, the first superconductor layer 16 ($S_1$) is formed of niobium (Nb) with a superconducting energy bandgap of $2\Delta=2.73\times10^{-3}$ eV, and the second superconductor layer 18 ($S_2$) is formed of aluminum (Al) with a superconducting energy bandgap of $2\Delta=3.4\times10^{-4}$ eV. In another example, the first superconductor layer 16 ($S_1$) is formed of niobium (Nb) with a superconducting energy bandgap of $2\Delta=2.72\times10^{-3}$ eV, and the second superconductor layer 18 ($S_2$) is formed of tin (Sn) with a superconducting energy bandgap of $2\Delta=11.5\times10^{-4}$ eV. In yet another example, the first superconductor layer 16 ($S_1$) is formed of tin (Sn) with a superconducting energy bandgap of $2\Delta=11.5\times10^{-4}$ eV and the second superconductor layer 18 ($S_2$) is formed of aluminum (Al) with a superconducting energy bandgap of $2\Delta=3.4\times10^{-4}$ eV. It is to be appreciated that a variety of different superconducting material layers and a different number of superconducting material layers could be employed as long as they are selected to having progressinginly decreasing superconducting energy bandgaps from the normal metal layer 12 to the normal metal layer quasiparticle trap 22.

The thickness of the first superconductor layer 16 ($S_1$) is selected to be about 1 coherence length to about 3 coherence lengths to maximize diffusion and to minimize recombination. This allows for the selection of a superconductor material with a higher transition temperature that can have a lower diffusion coefficient and/or higher recombination rate since the travel distance of the quasiparticles is minimized. The second superconductor layer is selected to have a higher diffusion coefficient and/or lower recombination coefficient. Additionally, the second superconductor layer 18 ($S_2$) functions as a transport layer that does not affect the function of the NIS junction as does the first superconductor layer. Therefore, the second superconductor layer 18 ($S_2$) does not have the limitation of operating ½ of its transition temperature, but can operate at or near its transition temperature. The thickness of the second superconductor layer 18 ($S_2$) should be at least 4 coherence lengths so it does not inverse-proximitize with the normal metal layer quasiparticle trap.

FIG. 3 illustrates a table of parameters of different superconductor pair combinations with a first superconductor layer that function as an energy filter and a second superconductor layer that functions as a transport layer. A first combination 42 includes niobium (Nb) as the first superconductor layer and aluminum (Al) as the second superconductor layer. Niobium (Nb) has superconducting transition temperature of 9.2 Kelvin, a superconducting energy gap of 1.36 meV, a diffusion coefficient of 8.7 cm$^2$/s and a recombination coefficient of 311 um$^3$/s. Aluminum has superconducting transition temperature of 1.2 Kelvin, a superconducting energy gap of 0.172 meV, a diffusion coefficient of 122 cm$^2$/s and a recombination coefficient of 22 um$^3$/s. The cryogenic temperature of the energy filter needs to be at ½ of the superconducting transition temperature for proper operation of the NISN junction. For Niobium, this temperature is about 4.6 Kelvin. The cryogenic temperature of the transport layer can be at its transition temperature. For aluminum, this temperature is about 1.2 Kelvin. Therefore, for this superconductor pair, the cryogenic temperature will need to be at 1.2 Kelvin to allow for proper operation of the first and the second superconductor layers.

A second combination includes niobium (Nb) as the first superconductor layer and tin (Sn) as the second superconductor layer. Tin has a superconducting transition temperature of 3.75 Kelvin, a superconducting energy gap of 0.57 meV, a diffusion coefficient of 371 cm$^2$/s and a recombination coefficient of 306 um$^3$/s. For this superconductor pair, the cryogenic temperature will need to be approximately at or lower than 3.75 Kelvin since this is ½ the transition temperature of niobium (Nb) to allow for proper operation of the first and the second superconductor layers. A third combination includes tin (Sn) as the first superconductor layer and aluminum (Al) as the second superconductor layer. For this superconductor pair, the cryogenic temperature will need to be approximately at or lower than 0.875 Kelvin since this is ½ the transition temperature of tin (Sn) (Tc=1.75 Kelvin) to allow for proper operation of the first and the second superconductor layers. As seen from all of these combinations, there is tradeoffs between the cryogenic temperatures needed, the diffusion coefficients and the recombination coefficients. Again, the above mentioned diffusion coefficients and recombination coefficients are just examples and could vary based on particular quality and process variances of the formation of the superconductor materials.

Figure 4:
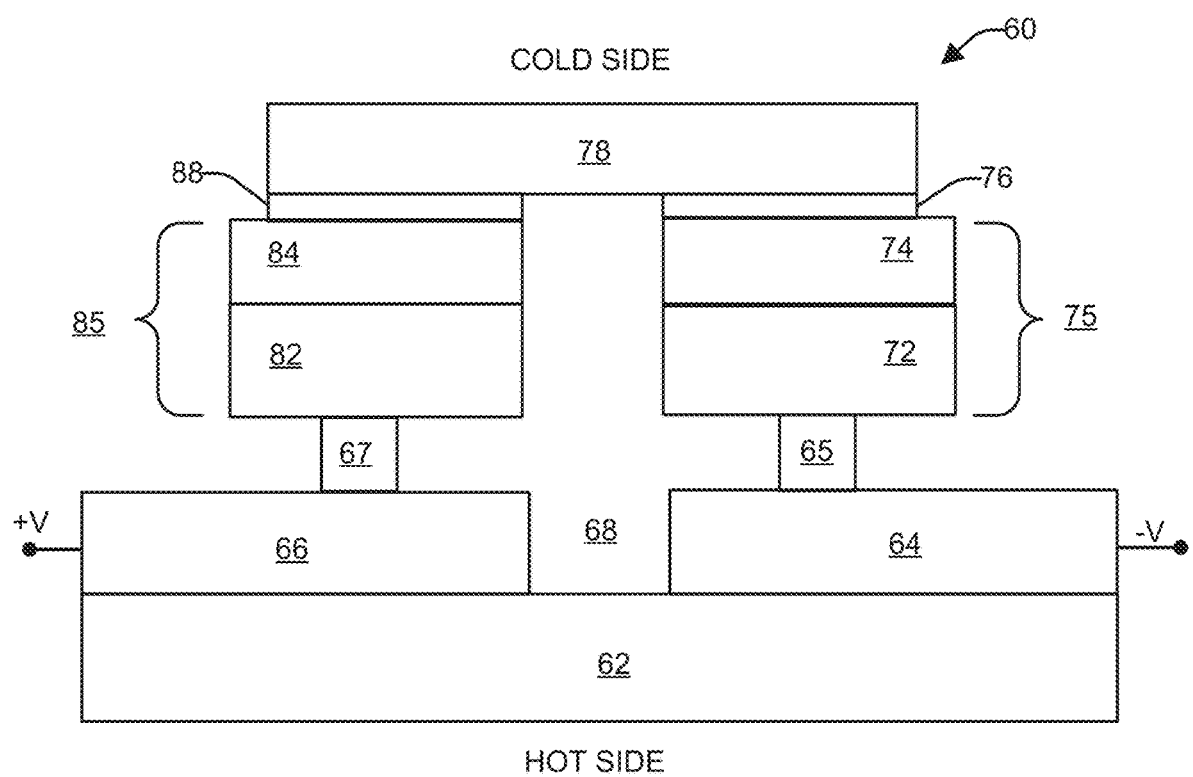
FIG. 4 illustrates an example schematic cross-sectional view of a solid state cooler device.

FIG. 4 illustrates a schematic cross-sectional view of an example of a solid state cooler device 60 that employs a pair of superconductor junctions. The solid state cooler device 60 can be configured as a refrigeration stage employed in a cryogenic cooling application in which the solid state structure is one of a plurality of solid state cooler devices disposed about a refrigeration container that resides in a vacuum and holds superconducting circuitry. The plurality of solid state structures can provide the final stage in a cryogenic refrigeration system, and allow for efficient cooling by removal of heat from a cold side of the refrigeration stage, and prevent the return of heat from the hot side of the last refrigeration stage within a plurality of refrigeration stages. The solid state cooler device can include a NIS$_1$S$_2$ junction or a NIS$_1$S$_2$N junction. The return of heat extracted from the cold side of the solid state cooler device is mitigated by employing a two layer superconductor structure having superconductor layers of decreasing bandgaps from the cold side to the hot side.

As illustrated in FIG. 4, the solid state cooler device 60 includes a substrate 62 that is disposed on a hot side of a refrigeration stage. A first conductive pad 64 is disposed on the substrate 62, and a second conductive pad 66 is disposed on the substrate 62. The first conductive pad 64 is spaced apart from the second conductive pad 66 by a gap 68. A first multilayer superconductor structure 75 includes a first side (or cold side) configured to face the cold side of the refrigerator stage and a second side (or hot side) configured to face the hot side of the refrigeration stage. The second side of the first multilayer superconductor structure 75 is coupled to the first conductive pad 64 by a normal metal bump bond 65. A second multilayer superconductor structure 85 includes a first side facing the cold side of the refrigeration stage, and a second side facing the hot side of the refrigeration stage. The second side of the second multilayer superconductor structure 85 is coupled to the second conductive pad 66 by a normal metal bump bond 67.

The first multilayer superconductor structure 75 includes a first superconductor layer 74, and a second superconductor layer 72. The second multilayer superconductor structure 85 includes a third superconductor layer 84, and a fourth superconductor layer 82. The first superconductor layer 74 and the third superconductor layer 84 are formed of a first superconductor material with a first energy bandgap, and the second superconductor layer 72 and the fourth superconductor layer 82 are formed of a second superconductor material with a second energy bandgap. The first energy bandgap is greater than the second energy bandgap. The diffusion coefficient of the second superconductor material is selected to be greater than the diffusion coefficient of the first superconductor material and/or the recombination coefficient of the second superconductor material is selected to be less than the recombination coefficient of the first superconductor material to allow for the rapid diffusion of quasiparticles and/or reduce the recombination of quasiparticles into Cooper pairs that results in the generation of heat in the superconductor materials.

A first insulating layer 76 is disposed between a surface of the first side of first multilayer superconductor structure 75, and a first end of a normal metal layer 78, and a second insulating layer 88 is disposed between a surface of the first side of the second multilayer superconductor structure 85, and a second end of the normal metal layer 78. The normal metal layer 78 is a shared normal metal layer. A bias voltage is applied between the first conductive pad 64 and the second conductive pad 66 to remove hot electrons from the normal metal layer 78. The bias voltage raises the energy level of the hot electrons on the normal metal layer 78. The first conductive pad 64 and the second conductive pad 66 can be formed from a normal metal or a superconducting metal. The first conductive pad 64 and the second conductive pad 66 act as a quasi-particle trap when formed of a normal metal.

The thickness of the first superconductor layer 74 and the third superconductor layer 84 is selected to be about 1 coherence length to about 3 coherence lengths to maximize diffusion and to minimize recombination. The thickness of the second superconductor layer 72 and the fourth superconductor layer 82 should be at least 4 coherence lengths so it does not inverse-proximitize with the normal metal layer quasiparticle trap. The normal metal layers and the normal metal bump bonds can be formed of a normal metal such as from one of gold, titanium, chromium, platinum, or another metal alloy that is above its superconducting transition temperature or a combination thereof. The superconductor material layers can be formed of niobium, tin, aluminum, or some other superconducting metal.

Quasiparticles (hot electrons) can fall in energy by inelastic collisions in the normal metal layer quasiparticle trap generating phonons on the hot side of the NIS$_1$S$^2$N junction as desired. These phonons tend to leak backwards from the normal metal layer quasiparticle trap into the superconductor structure of the NISN junction resulting in the generation of heat in the superconductor material. The normal metal bump bonds coupling the superconductor structure to the normal metal layer quasiparticle trap mitigate this problem. The normal metal bump bonds form a point cooler that allows for electrons to readily travel to the normal metal layer quasiparticle trap, while inhibiting the phonons from traveling back from the normal metal layer quasiparticle trap to the superconductor structure due to the small cross-sectional area of the normal metal bump bonds compared to a direct contact between the quasiparticle trap and the superconductor structure.

Figure 5:
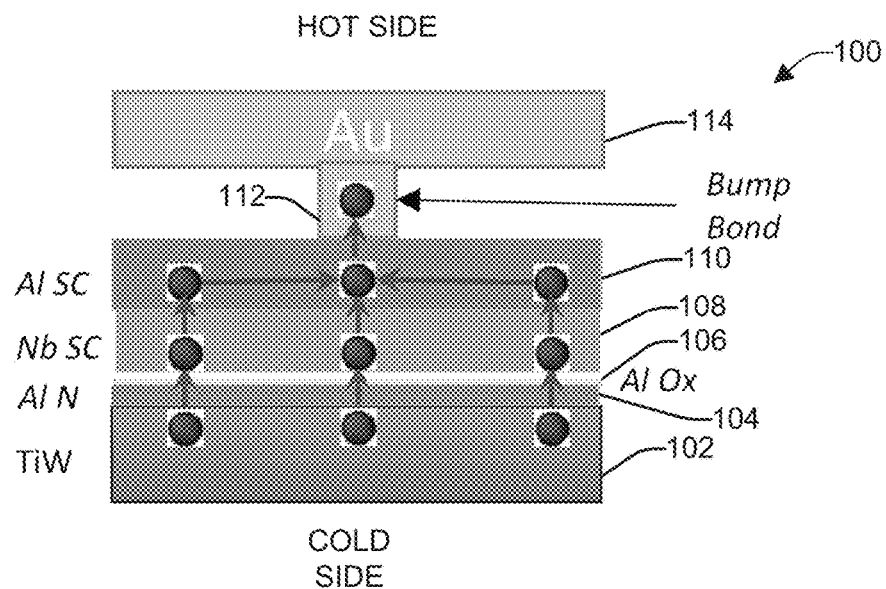
FIG. 5 illustrates a schematic cross-sectional view of an example of a superconductor junction with a bump bond coupling the second superconductor layer to a normal metal layer quasiparticle trap.

FIG. 5 illustrates a cross-sectional view of an example $NIS_1S_2N$ junction 100 that includes a normal metal bump coupling a superconductor structure to a normal quasiparticle trap that could be employed in the cooler of FIG. 4. The $NIS_1S_2N$ junction 100 includes a normal metal layer 102 disposed on a cold side of a cryogenic stage. In this example, the normal metal layer 102 is formed of titanium tungsten (TiW) alloy. A very thin and inverse-proximitized aluminum layer 104 that includes an aluminum oxidized portion 106 is disposed over the normal metal layer 102. The aluminum oxidized portion 106 forms the insulator of the $NIS_1S_2N$ junction 100. A first superconductor layer 108 is disposed over the aluminum oxidized portion 106. In this example, the first superconductor layer 108 is formed of niobium (Nb). A second superconductor layer 110 is disposed over the first superconductor layer 108. In this example, the second superconductor layer 110 is formed of aluminum (Al). A normal metal layer quasiparticle trap 114 is disposed over the second superconductor layer 110 and coupled to the second superconductor layer 110 through a normal metal bump bond 112. In this example, both the normal metal layer quasiparticle trap 114 and the normal metal bump bond 112 are formed of gold.

The normal metal bump bond 112 allows for electrons to readily travel to the normal metal layer quasiparticle trap 114, while inhibiting the phonons from traveling back from the normal metal layer quasiparticle trap 114 to the second superconductor layer 110. As illustrated in FIG. 5, hot electrons move from the normal metal layer 102 through the aluminum layer 104, the aluminum oxidized portion 106 (i.e., aluminum oxide layer), as quasiparticles through the first superconductor layer 108 and the second superconductor layer 110 to the normal metal layer quasiparticle trap 114 through the normal metal bump bond 112 to the hot side of the cryogenic stage where the hot electrons can dissipate heat. Those electrons that couple into phonons are inhibited from travelling back into the second superconductor layer 110 due to the small cross-sectional area of the normal metal bump bond 112. The thickness of the first superconductor layer can be selected to be about 1 coherence length to about 3 coherence lengths to maximize diffusion and to minimize recombination. The thickness of the second superconductor layer should be at least 4 coherence lengths so it does not proximitize with the normal metal layer quasiparticle trap.

Figure 6:
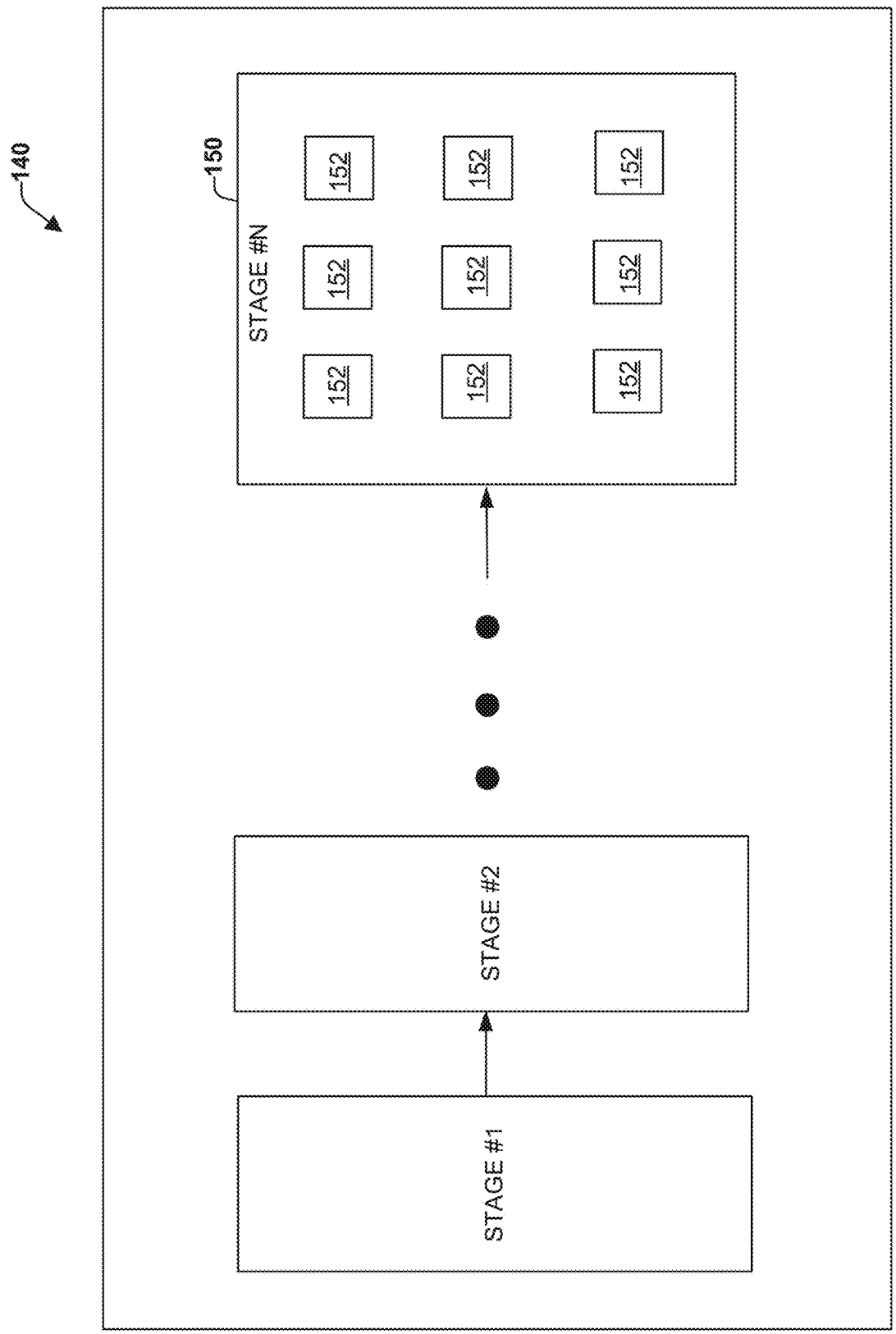
FIG. 6 illustrates a block diagram of a refrigeration system that employs solid state devices such as the solid state device of FIGS. 1, 4 and 5.

FIG. 6 illustrates a block diagram of a refrigeration system 140 that employs solid state devices such as the solid state device of FIG. 1, FIG. 4 and FIG. 5. The refrigeration system 140 includes a plurality of stages labeled stage #1 to stage #N, where N is an integer greater than or equal to 2. Each refrigeration stage provides an additional temperature drop from the previous stage, such that the Nth stage is the final stage and provides the last temperature drop and lowest temperature of the refrigeration system 140. In other examples, the Nth stage is a first or intermediary stage as opposed to the last stage. Stage #N in the refrigeration system 140 includes a refrigeration container 150 with a plurality of solid state devices 152 similar to that illustrated in FIG. 1, FIG. 4 or FIG. 5 disposed about the container and cooperating to provide the final lowest temperature of the refrigeration system 140 within the refrigeration container 150. The refrigeration container 150 can be in a vacuum environment and be configured to house superconducting circuitry. In another example, one or more of the other stages employ solid state devices similar to those in stage #N to provide incremental temperature drops across the refrigeration system 140. In other examples, the refrigeration container 150 can be formed of a normal metal that provides the final normal metal layer of each solid state devices 152.

Figure 7:
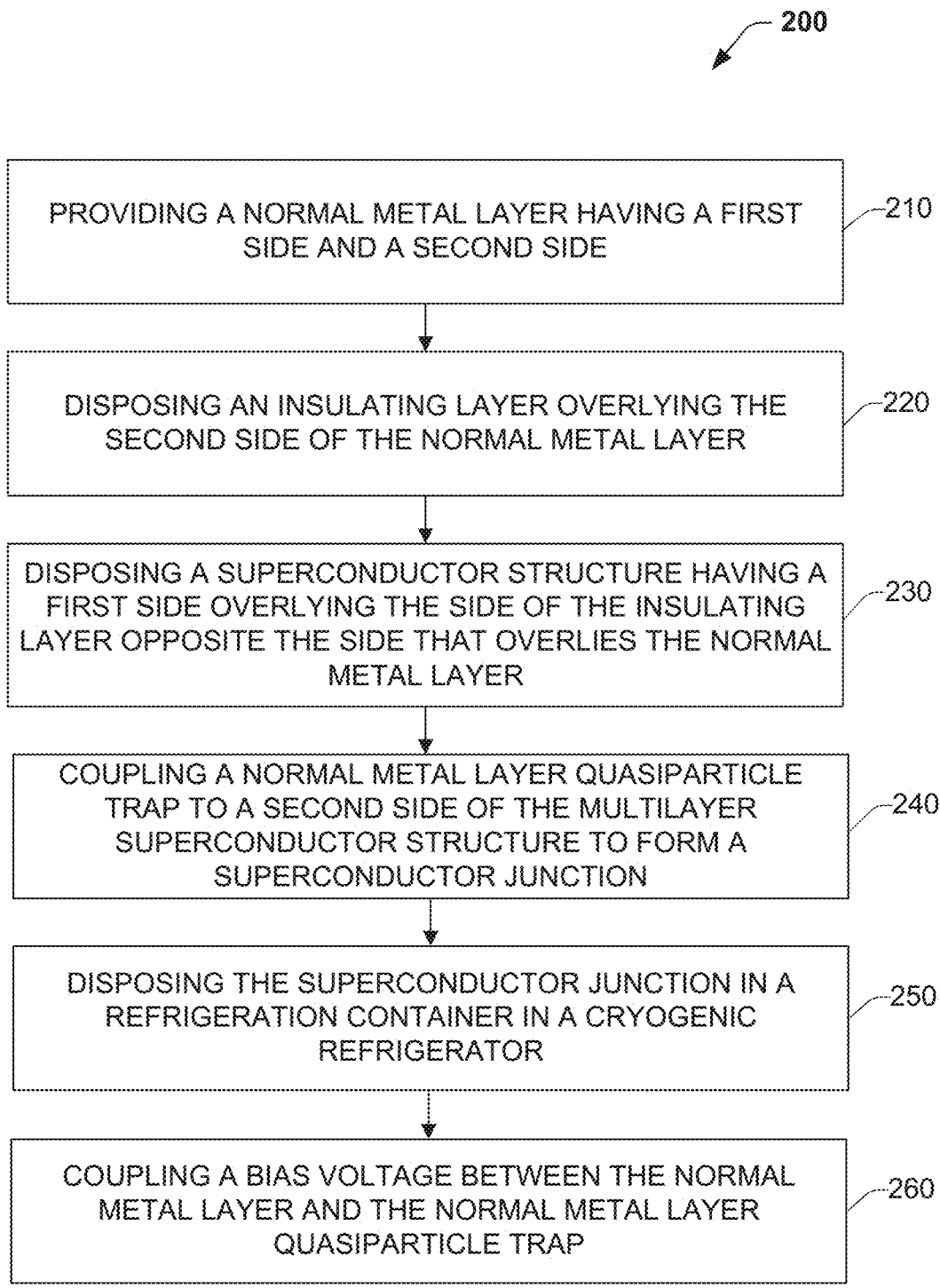
FIG. 7 illustrates a method of forming a superconductor junction.

FIG. 7 illustrates an example of a method 200 for providing a superconductor junction. At 210, a normal metal layer is provided having a first side and a second side. At 220, an insulating layer is disposed over the second side of the normal metal layer. The insulating layer can be a result of deposition of an insulating material or deposition of a metal layer and oxidization of the metal layer. At 230, a multilayer superconductor structure is disposed over the insulating layer. The multilayer superconductor structure has a first side that overlies a side of the insulating layer opposite the side that overlies the normal metal layer. The multilayer superconductor structure includes a first superconductor layer formed of a first superconductor material and a second superconductor layer formed of a second superconductor material. The first superconductor layer has a first side disposed over the insulating layer and the second superconductor layer has a first side disposed over a second side of the first superconductor layer.

The first superconductor material is selected to have an energy bandgap that is greater than energy bandgap of the first superconductor material. The diffusion coefficient of the second superconductor material is selected to be greater than the diffusion coefficient of the first superconductor material and/or the recombination coefficient of the second superconductor material is selected to be less than the recombination coefficient of the first superconductor material to allow for the rapid diffusion of quasiparticles and/or reduce the recombination of quasiparticles into Cooper pairs that results in the generation of heat in the superconductor materials. The thickness of the first superconductor layer can be selected to be about 1 coherence length to about 3 coherence lengths to maximize diffusion and to minimize recombination. The thickness of the second superconductor layer should be at least 4 coherence lengths so it does not inverse-proximitize with the normal metal layer quasiparticle trap.

At 240, a normal metal layer quasiparticle trap is coupled to a second side of the multilayer superconductor structure and thus a second side of the second superconductor layer via a normal metal bump bond or by disposing the normal metal layer quasiparticle trap directly over the second superconductor layer to form a superconductor junction. At 250, the superconductor junction is disposed about a refrigeration container of a cryogenic refrigerator, for example, along with a number of other similar superconductor junctions. Next, at 260, a bias voltage is coupled between the normal metal layer and the normal metal layer quasiparticle trap for removal of hot electrons from the normal metal layer through the insulating layer and the multilayer superconductor structure to the normal metal layer quasiparticle trap.

For purposes of simplification of explanation the terms "overlay", "overlaying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation are for purposes of illustration. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. A superconductor junction comprising:
a normal metal layer having a first side and a second side;
an insulating layer overlying the second side of the normal metal layer;
a first superconductor layer formed of a first superconductor material, the first superconductor layer having a first side overlying a side of the insulating layer opposite the side that overlies the normal metal layer;
a second superconductor layer formed of a second superconductor material, the second superconductor layer having a first side overlying a side of the first superconductor material opposite the side that overlies the insulating layer, the second superconductor material has a higher diffusion coefficient than the first superconductor material and/or the second superconductor material has a lower recombination coefficient than the first superconductor layer, wherein the first superconductor layer has a thickness of about 1 coherence length to about 3 coherence lengths associated with the first superconductor material and the second superconductor layer has a thickness of at least 4 coherence lengths associated with the second superconductor material; and
a normal metal layer quasiparticle trap coupled to a second side of the second superconductor layer.

2. The superconductor junction of claim 1, wherein the first superconductor layer has an energy bandgap greater than the energy bandgap of the second superconductor layer.

3. The superconductor junction of claim 1, wherein a bias voltage applied between the normal metal layer and the normal metal layer quasiparticle trap causes hot electrons to be removed from the normal metal layer through the insulating layer, the first superconductor layer and the second superconductor layer to the normal metal layer quasiparticle trap.

4. The superconductor junction of claim 1, further comprising a normal metal bump bond coupling the normal metal layer quasiparticle trap to the second side of the second superconductor layer, the normal metal bump bond being configured to allow quasiparticles to flow to the normal metal layer quasiparticle trap, while inhibiting phonons from traveling back from the normal metal layer quasiparticle trap to the second superconductor layer.

5. The superconductor junction of claim 1, wherein the first superconductor layer is formed of niobium (Nb) and the second superconductor layer is formed of aluminum (Al).

6. The superconductor junction of claim 1, wherein the first superconductor layer is formed of niobium (Nb), and the second superconductor layer is formed of tin (Sn).

7. The superconductor junction of claim 1, wherein the first superconductor layer is formed of tin (Sn), and the second superconductor layer is formed of aluminum (Al).

8. The superconductor junction of claim 1, wherein the second superconductor layers has a film layer thickness that is ¼ wavelength or a multiple of a ¼ wavelength of the dominant phonon associated with an operating temperature of the second superconductor material.

9. A solid state cooler comprising the superconductor junction as claimed in claim 1.

10. A refrigeration system comprising a plurality of refrigeration stages, wherein at least one stage of the refrigeration system comprises a refrigeration container and a plurality of superconductor junctions as claimed in claim 1 disposed about the refrigeration container.

11. A cooler device comprising:
a pair of normal metal-insulator-superconductor-superconductor-normal metal ($NIS_1S_2N$) junctions, each $NIS_1S_2N$ junction comprising:
a normal metal layer having a first side and a second side;
an insulating layer overlying the second side of the normal metal layer;
a first superconductor layer formed of a first superconductor material, the first superconductor layer having a first side overlying a side of the insulating layer opposite the side that overlies the normal metal layer;
a second superconductor layer formed of a second superconductor material, the second superconductor layer having a first side overlying a side of the first superconductor material opposite the side that overlies the insulating layer, the second superconductor material has a higher diffusion coefficient than the first superconductor material and/or the second superconductor material has a lower recombination coefficient than the first superconductor layer, wherein the first superconductor layer has a thickness of about 1 coherence length to about 3 coherence lengths associated with the first superconductor material and the second superconductor layer has a thickness of at least 4 coherence lengths associated with the second superconductor material; and
a normal metal layer quasiparticle trap coupled to a second side of the second superconductor layer via a normal metal bump bond; and
wherein a bias voltage applied between the normal metal layer quasiparticle trap of a first $NIS_1S_2N$ junction of the pair of $NIS_1S_2N$ junctions and the normal metal layer quasiparticle trap of a second $NIS_1S_2N$ junction of the pair of $NIS_1S_2N$ junctions causes hot electrons to be removed from the normal metal layer through the insulating layer of the second $NIS_1S_2N$ junction, the first superconductor layer of the second $NIS_1S_2N$ junction, the second superconductor layer of the second NIS$_1$S$_2$N junction to the normal metal layer quasiparticle trap of the second NIS$_1$S$_2$N junction.

12. The cooler device of claim 11, wherein the first superconductor layer has an energy bandgap greater than the energy bandgap of the second superconductor layer for both the first NIS$_1$S$_2$N junction and the second NIS$_1$S$_2$N junction of the pair of NIS$_1$S$_2$N junctions.

13. The cooler device of claim 11, wherein the normal metal layer for the first NIS$_1$S$_2$N junction and the normal metal layer for the second NIS$_1$S$_2$N junction is a single shared normal metal layer.

14. The cooler device of claim 11, wherein the first superconductor layer is formed of niobium (Nb), and the second superconductor layer is formed of aluminum (Al) for at least one of the first NIS$_1$S$_2$N junction and the second NIS$_1$S$_2$N junction of the pair of NIS$_1$S$_2$N junctions.

15. The cooler device of claim 11, wherein the first superconductor layer is formed of niobium (Nb), and the second superconductor layer is formed of tin (Sn) for at least one of the first NIS$_1$S$_2$N junction and the second NIS$_1$S$_2$N junction of the pair of NIS$_1$S$_2$N junctions.

16. The superconductor junction of claim 11, wherein the first superconductor layer is formed of tin (Sn), and the second superconductor layer is formed of aluminum (Al) for at least one of the first NIS$_1$S$_2$N junction and the second NIS$_1$S$_2$N junction of the pair of NIS$_1$S$_2$N junctions.

17. A refrigeration system comprising a plurality of refrigeration stages, wherein at least one stage of the refrigeration system comprises a refrigeration container and a plurality of cooler devices as claimed in claim 11 disposed about the refrigeration container.

18. A method of forming a superconductor junction, the method comprising:
provided a normal metal layer having a first side and a second side;
disposing an insulating layer over the second side of the normal metal layer;
disposing a first superconductor layer formed of a first superconductor material with a first side over a side of the insulating layer opposite the side that overlies the normal metal layer;
disposing a second superconductor layer formed of a second superconductor material with a first side over a side of the first superconductor layer opposite the side that overlies the insulating layer, the second superconductor material has a higher diffusion coefficient than the first superconductor material and/or the second superconductor material has a lower recombination coefficient than the first superconductor layer, wherein the first superconductor layer has a thickness of about 1 coherence length to about 3 coherence lengths associated with the first superconductor material and the second superconductor layer has a thickness of at least 4 coherence lengths associated with the second superconductor material; and
coupling a normal metal layer quasiparticle trap to a second side of the second superconductor layer with or without a normal metal bump bond.

19. The method of claim 18, further comprising coupling a bias voltage between the normal metal layer and the normal metal layer quasiparticle trap to remove hot electrons from the normal metal layer through the insulating layer, the first superconductor layer and the second superconductor layer to the normal metal layer quasiparticle trap.

20. The method of claim 18, further comprising disposing the superconductor junction about a refrigeration container along with a plurality of additional superconductor junctions to form a last stage of a refrigeration system.

* * * * *